United States Patent [19]
Baier et al.

[11] Patent Number: 5,204,226
[45] Date of Patent: Apr. 20, 1993

[54] PHOTOSENSITIZERS FOR POLYSILANES

[75] Inventors: Mark E. Baier, Sonora; Robert D. Miller, San Jose; Gregory M. Wallraff, Morgan Hill, all of Calif.

[73] Assignee: International Business Machines Corporation, Armonk, N.Y.

[21] Appl. No.: 664,260

[22] Filed: Mar. 4, 1991

[51] Int. Cl.$^5$ .................................................. G03F 7/30
[52] U.S. Cl. ...................................... 430/326; 430/270
[58] Field of Search ................................. 430/326, 270

[56] References Cited

U.S. PATENT DOCUMENTS

| | | | |
|---|---|---|---|
| 3,163,534 | 12/1964 | Adams et al. | 96/75 |
| 3,767,628 | 10/1973 | Kline et al. | 260/78 |
| 3,932,352 | 1/1976 | Freedman et al. | 260/45.8 N |
| 4,009,324 | 2/1977 | Freedman et al. | 526/6 |
| 4,289,845 | 9/1981 | Bowden et al. | 430/296 |
| 4,544,729 | 10/1985 | Nate et al. | 430/270 X |
| 4,587,205 | 5/1986 | Harrah et al. | 430/326 |
| 4,618,564 | 10/1986 | Demmer et al. | 430/326 X |
| 4,639,480 | 1/1987 | Birum et al. | 524/104 |
| 4,957,988 | 9/1990 | Irving et al. | 430/326 X |
| 5,002,853 | 3/1991 | Aoai et al. | 430/326 X |

FOREIGN PATENT DOCUMENTS 62-99746  5/1987  Japan ................................. 430/270

OTHER PUBLICATIONS

Rosilio, C. et al., "Contribution to the Study of Polysilanes for Photography", Microelectric Engineering 6 (1987) 399–406.

Miller, R. D. et al., "Soluble Polysilane Derivative: Interesting New Radiation-Sensitive Polymers", American Chemical Soceity, 1984.

Diaz, A., et al., "Electrooxidation of Submitted Silane High Polymers", Polymer Prepr. (American Chem. Soc. Div. Polym. Chem., 1985, 26(1) 125-6 (Eng.) CA 103:88297f (only Abstract) given and considered.

Taylor, G. et al., "Lithographic Photochemical and Oxygen RIE Properties of Three Polysilane Copolymers", Proc. SPIE Int. Soc. Opt. Eng., 1988 Adv. Resist Technol. Process 5, 274-90 (Eng.) Abstract only CA 110:182759z.

Hayase et al., "Polysilane Compound and Bilayer Photoresist Containing It", JP Appl., 87/122,409, 21 May 1987, Dec. 1988 (Abstract only) CA 111:31346g.

Miller, R. D., "Radiation Sensitivity of Soluble Polysilane Derivatives", Adv. Chem. Ser. 1987 (pub. 1990) Abstract only 112: 128881m.

Ito, et al., "Photosensitive Resin Compositions for Fine Patterning", JP 88/134,264, May 31, 1988, 10 pp. Abstract only CA 113: 32000t.

Miller, et al., "Polysilane High Polymers", IBM Res. Div. Alamden, San Jose, American Chemical Society, 1989.

Primary Examiner—Cynthia Hamilton
Attorney, Agent, or Firm—Robert B. Martin

[57] ABSTRACT

The present invention relates to positive resist compositions comprising polysilanes and sulfosuccinimide photosensitizers and the use of these compositions in making integrated circuits.

2 Claims, 2 Drawing Sheets

PHOTOSENSITIZERS FOR POLYSILANES

FIELD OF THE INVENTION

The present invention relates to photosensitizers for polysilanes for use as photoresist in the manufacture of integrated circuits.

BACKGROUND OF THE INVENTION

There is a desire in the industry for higher circuit density in microelectronic devices made using lithographic techniques. One method of achieving higher area density is to improve resolution of circuit patterns in resist films. The use of shorter wavelength radiation (e.g. deep UV-220 to 280 nm) than the currently employed near and mid-UV spectral range (300 nm to 450 nm) offers the potential for improved resolution. However, with deep UV radiation, fewer photons are transferred for the same energy dose to achieve the same photochemical response. Further, current lithographic tools have greatly attenuated output in the deep UV spectral region. Therefore, there is a need in the art to develop resist materials which are more sensitive to radiation in deep UV.

Polysilanes are known in the art for use as a resist e.g. in making a bilayer photoresist. The bilayer resist comprises an imaging oxygen plasma resistant polysilane layer over a planarizing polymer layer coated on a substrate. When the resist is imaged, the radiation causes photochemical degradation of the exposed polysilane into lower molecular weight materials. Photochemical degradation is accompanied by a proportional amount of spectral bleaching which is used in the art to measure the degree of degradation. Degradation of the exposed polysilane enables wet development of a positive image with common organic solvents. The image is then transferred through the underlying polymer layer to the substrate by oxygen plasma development. However, current polysilanes lack sensitivity and require large radiation doses of 100 to 400 millijoules/cm$^2$ for suitable imaging and therefore are generally less desirable for commercial use especially in deep UV.

Polysilane polymers have been sensitized towards photodecomposition by incorporating certain agents into the polymer. Miller et al., Materials for Microlithography ACS Symposium Series 266, page 293, 1984, discloses incorporating 1,4-bis(trichloromethyl)benzene or 1,3,5-tris (trichloromethyl)triazine into polysilane to increase the rate of spectral bleaching upon irradiation. However, there is a desire in the electronics industry to avoid the use of chlorinated materials in resist compositions.

Freedman et al. in U.S. Pat. No. 3,932,352 issued Jan. 13, 1976, discloses the use of N-halosuccinimide to enhance photodegradation of plastic material such as polyolefin film. However, it is preferred in the industry to avoid halogenated materials in resist compositions. It is therefore an object of the present invention to provide improved photosensitizers for polysilane resist compositions.

Other objects and advantages will become apparent from the following disclosure.

SUMMARY OF THE INVENTION

The present invention relates to a positive resist composition comprising polyarylsilane and sulfosuccinimide. Suitable sulfosuccinimides for use in the composition of the present invention include alkyl, haloalkyl and phenylsulfosuccinimide.

The present invention also relates to a process for generating positive tone resist images using the composition of the present invention.

BRIEF DESCRIPTION OF THE DRAWINGS

A more thorough disclosure of the present invention is presented in the detailed description which follows and from the accompanying drawing in which.

DETAILED DESCRIPTION OF THE INVENTION

Figure 1:
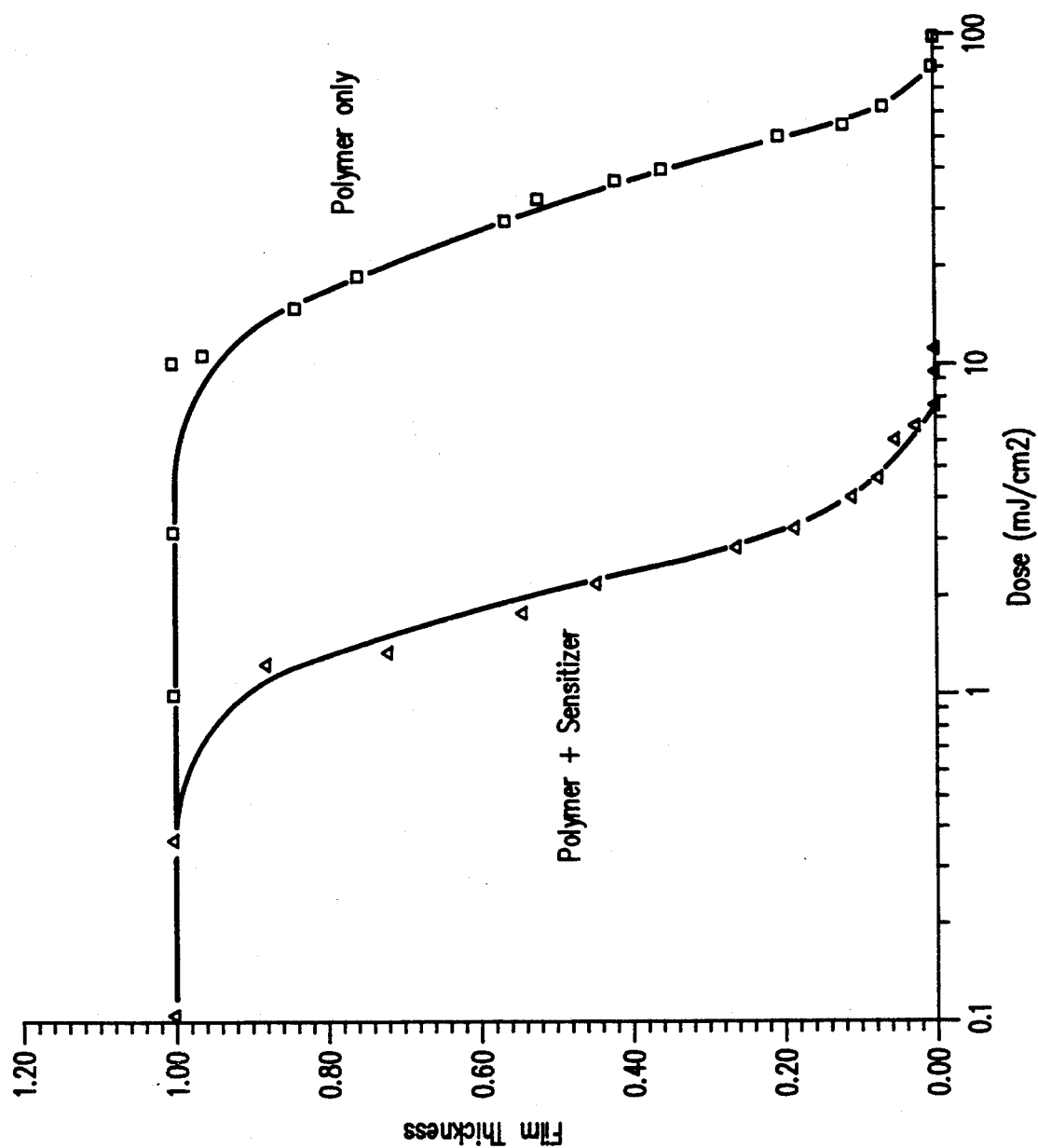
FIG. 1 is a sensitivity contrast curve for polymethylphenylsilane and FIG. 2 is a sensitivity contrast curve for poly(ethyl-t-butylphenyl)silane.

The present invention relates to a positive resist composition comprising polyarylsilane and sulfosuccinimide.

Suitable polyarylsilanes for use in the composition of the present invention are polyphenylsilanes which include poly(alkylphenyl)silane and poly(bisphenyl)silane Suitable poly(alkylphenyl)silanes include poly lower alkyl ($C_1$–$C_8$) phenyl silanes where the lower alkyl substituent is linear, branched or cyclic such as methyl, ethyl, propyl, butyl, hexyl or the like. The alkyl and phenyl substituent of the polysilane can be each independently substituted with one or more of a variety of substituents such as alkyl, alkoxy, alkylamino, or alkoxyalkyl. Other suitable substitutents which do not interfere with the photodegradation of the polyphenylsilane and do not effect the desired properties of the polyphenylsilane will be known to those skilled in the art. Polynaphthylsilane can also be used in the composition of the present invention.

Preferred polyphenylsilanes are poly(alkylphenyl) silanes such as poly(ethyl phenyl silane), poly(ethyl p-tertbutylphenyl) silane, poly (hexylphenyl) silane and poly (ethyl-p-methoxyphenyl)silane.

The polymer can be conveniently prepared by admixing at an elevated temperature the corresponding alkyl/phenylphenyldichlorosilane monomer in a suitable solvent such as toluene with sodium dispersed in toluene The addition of diglyme or crown ethers may increase reaction yield but also lower the molecular weight of the polymer. Suitable molecular weights for the polyphenylsilane are about 30,000 to 3,000,000. Polymers having a glass transition temperature above room temperature are preferred for ease of processing and a higher temperature for dimensional stability during oxygen plasma development.

The polyphenylsilane for use in the composition of the present invention can also be a copolymer formed with alkylphenylsilylene and other silyene units such as bis-alkysilylene and compositions with such copolymers are contemplated as equivalents of the compositions claimed herein.

The composition of the present invention also comprises sulfosuccinimide. Suitable sulfosuccinimides for use in the composition of the present invention include alkyl, haloalkyl and phenyl sulfosuccinimide. Suitable sulfosuccinimide have the formula:

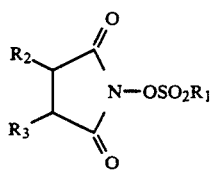

where $R_1$ is alkyl, alkenyl, haloalkyl or phenyl and $R_2$ and $R_3$ are each independently hydrido, alkyl, alkenyl, phenyl or $R_2$ and $R_3$ are together cyclic alkyl or alkenyl or a 6-membered benzenoid ring. $R_1$ as alkyl or alkenyl can be linear or branched or cyclic and is suitably lower alkyl ($C_1$-$C_8$) such as methyl, ethyl or hexyl. $R_1$ as haloalkyl is conveniently perhaloalkyl such as perfluoroalkyl e.g. trifluoromethyl. $R_2$ and $R_3$ independently or together as alkyl or alkenyl can be linear, branched or cyclic and suitably lower alkyl or alkenyl ($C_1$-$C_8$) such as methyl, ethyl, hexyl or norbornylene. $R_1$, $R_2$ and $R_3$ as phenyl can be substituted with suitable substituents such as alkyl, haloalkyl, cyano or other electron withdrawing substituents which do not interfere with the photosensitizing properties of the sulfosuccinimide. The sulfosuccinimides used in the compositions of the present invention can be readily made by art known techniques.

The compositions of the present invention can be readily prepared by admixing the polyphenylsilane with the sulfosuccinimide. Generally the composition will comprise about 88 to about 97 mole % (based on the molecular weight of the monomer unit) of the polyphenylsilane and about 3 to about 12 mole % of the sulfosuccinimide preferably about 8 mole %.

The process of the present invention for generating positive tone resist image in a film comprises the steps of (a) forming a film comprising polyphenylsilane and sulfosuccinimide; (b) imagewise exposing the film to radiation and (c) developing the image by art known techniques such as by treatment with an organic solvent. The thin film can be coated directly onto a substrate or more preferably as the top layer of a bilayer resist.

The first step of the process of the present invention involves forming the film on the planarizing bottom polymer layer of a bilayer resist or on a substrate. Suitable substrates include silicon, ceramics, glass, quartz or the like. The film can be formed using art known techniques such as spin or spray coating, or doctor blading.

In the second step of the process, the film is imagewise exposed to electromagnetic radiation suitably at a wavelength of about 200 to 500 nm, preferably 200-300 nm. Suitable radiation sources include various arc lamps such as mercury, deuterium or excimer laser sources. The radiation causes photodegradation of the polyphenylsilane into lower molecular weight fragments which are soluble in organic solvents. The sulfosuccinimide accelerates the photodegradation of the polyphenylsilane to enable more rapid photodegradation and degradation of the polyphenylsilane into lower molecular weight material with smaller radiation doses. The sulfosuccinimide also facilitates photodegradation at shorter wavelengths such as deep UV.

The third step involves development of the image. Suitable development can be done with organic solvent mixtures such as toluene-cyclohexanol, t-butylacetate-isopropanol, n-butylacetate-isopropanol and other like mixtures using art known techniques.

A preferred process of the present invention involves a bilayer resist and comprises the steps of (a) coating a substrate with a planarizing polymer layer; (b) coating the polymer layer with a film comprising polyphenylsilane and sulfosuccinimide; (c) imagewise exposing the film to radiation (d) developing the image in the film by ar known techniques such as by treatment with an organic solvent and (e) transferring the image through the polymer to the substrate by art known techniques such as oxygen plasma development e.g. $O_2$-RIE. Suitable planarizing polymers include hardbaked diazonaphthoquinone novolac, polyimides, polyesters, polyacrylates and the like. It is desired that the imaging layer not admix with the planarizing layer during the coating process.

The present invention also relates to an integrated circuit comprising a circuit made by the steps of (a) forming a film over a nonconductive substrate, said film comprising polyphenylsilane and sulfosuccinimide; (b) imagewise exposing the film to radiation; (c) developing the image to the substrate by art known techniques and (d) forming the circuit in the developed film on the substrate by art known techniques. Preferably, the circuit is formed in a bilayer resist.

In the bilayer resist, the image in the polyphenylsilane is transferred through the underlying planarizing polymer layer to the substrate by art known techniques such as oxygen plasma development. After the substrate has been exposed, circuit patterns can be formed in the exposed areas by coating the substrate with a conductive material such as conductive metals by art known techniques such as evaporation, sputtering, chemical vapor deposition or laser induced deposition. Dielectric materials may also be deposited by similar means during the process of making circuits. Inorganic ions such as boron, phosphorous or arsenic can be implanted in the substrate in the process for making p or n doped circuit transistors. Other means for forming circuits will be known by those skilled in the art.

The following examples are detailed descriptions of methods of preparation and use of certain compositions of the present invention. The detailed preparations fall within the scope of, and serve to exemplify, the more generally described methods of preparation set forth above. The examples are presented for illustrative purposes only, and are not intended as a restriction on the scope of the invention. All temperatures are in degrees Celsius.

EXAMPLE 1 SYNTHESIS

I. Poly(ethylphenylsilane)—A clean, dry 500 mL flat bottom resin flask equipped with a condenser, argon inlet, addition funnel, and teflon mechanical stirrer was charged with 55 mL toluene and 2.0 g sodium (0.087 mol). The mixture was brought to reflux and stirred at 1800 rpm for 45 minutes producing a fine dispersion. After cooling to room temperature, 25 mL more toluene was added and the mixture heated to 65° in oil bath. A 50% solution (by volume) of 8.7 g ethylphenyldichlorosilane (0.087 mol) in toluene was added dropwise over approx. 10 min. while stirring (600 RPM), producing a viscous, purple reaction mixture. Quenching with isopropanol and work up of the reaction resulted in 1.16 g (20% yield) of a colorless solid, poly(ethylphenylsilane) molecular weight Mw is $9.2 \times 10^5$ Daltons: Anal. Calc'd for $C_8H_{10}Si$: C, 71.57; H, 7.51 Si, 20.92; Found: C 71.47; H, 7.45; Si, 20.91.

II. N-(trifluoromethylsulfonoxy)phthalimide "PIT'-'—To a 4-necked 5-L round-bottomed flask equipped with a 500-mL addition funnel, thermocouple, Ar inlet and overhead stirrer was added 372 g (2.28 mol) of N-hydroxyphthalimide and 2500 mL of $CHCL_3$. The suspension was cooled in ice to 5° C. and 643 g (2.28 mol) of triflic anhydride was added neat via the addition funnel over 10 min. followed by 150 mL of $CHCl_3$ as a chaser. The addition funnel was then charged with 180.4 g of pyridine diluted to 500 mL with $CHCL_3$ and subsequently added dropwise at a rate such that the temperature remained below 10° C. (2 hr). Any excess pyridine results in a significant exotherm and color change. The suspension was allowed to reach room temperature with 500 mL of $CHCl_3$, and the filtrate washed 4×500 mL with water. The solution was then dried, with stirring, for 1 hr over $MgSO_4$, filtered, and treated with 80 g of decolorizing carbon. After stirring for 15 min, the suspension was filtered on a Celite pad and the filtrate evaporated at 40° C. (30 mmHg) on a rotary evaporator. The residue was taken up in 3500 mL of boiling cyclohexane, filtered hot and allowed to crystallize overnight to yield 536 g (80%) as white flakes, mp 100.5-103.

EXAMPLE 2

I. Films of polymethylphenysilane "PMPS" (1.2-0.5 microns) with and without about 10 mole % of a sulfosuccinimide selected from PIT and p-methylphenylsulfonoxyphthalimide "PIT-Tos" were spin coated onto a quartz substrate. The films were irradiated with 12 to 96 millijoules/$cm^2$ of 254 nm radiation and the absorbance was measured at the wavelength $\lambda_{max}$ by a diode array UV-Vis spectrometer. The results were as follows:

| Radiation Dose (mJ/$cm^2$) | Absorbance by Film | | PMPS & PIT-Tos |
|---|---|---|---|
| | PMPS | PMPS & PIT | |
| 0 | 100 | 100 | 100 |
| 12 | 93 | 58 | 68 |
| 24 | 86 | 48 | 53 |
| 36 | 78 | 43 | 42 |
| 48 | 72 | 37 | 33 |
| 60 | 68 | 32 | 27 |
| 72 | 64 | 28 | 23 |
| 84 | 58 | — | 20 |
| 96 | 55 | — | 17 |

Figure 2:
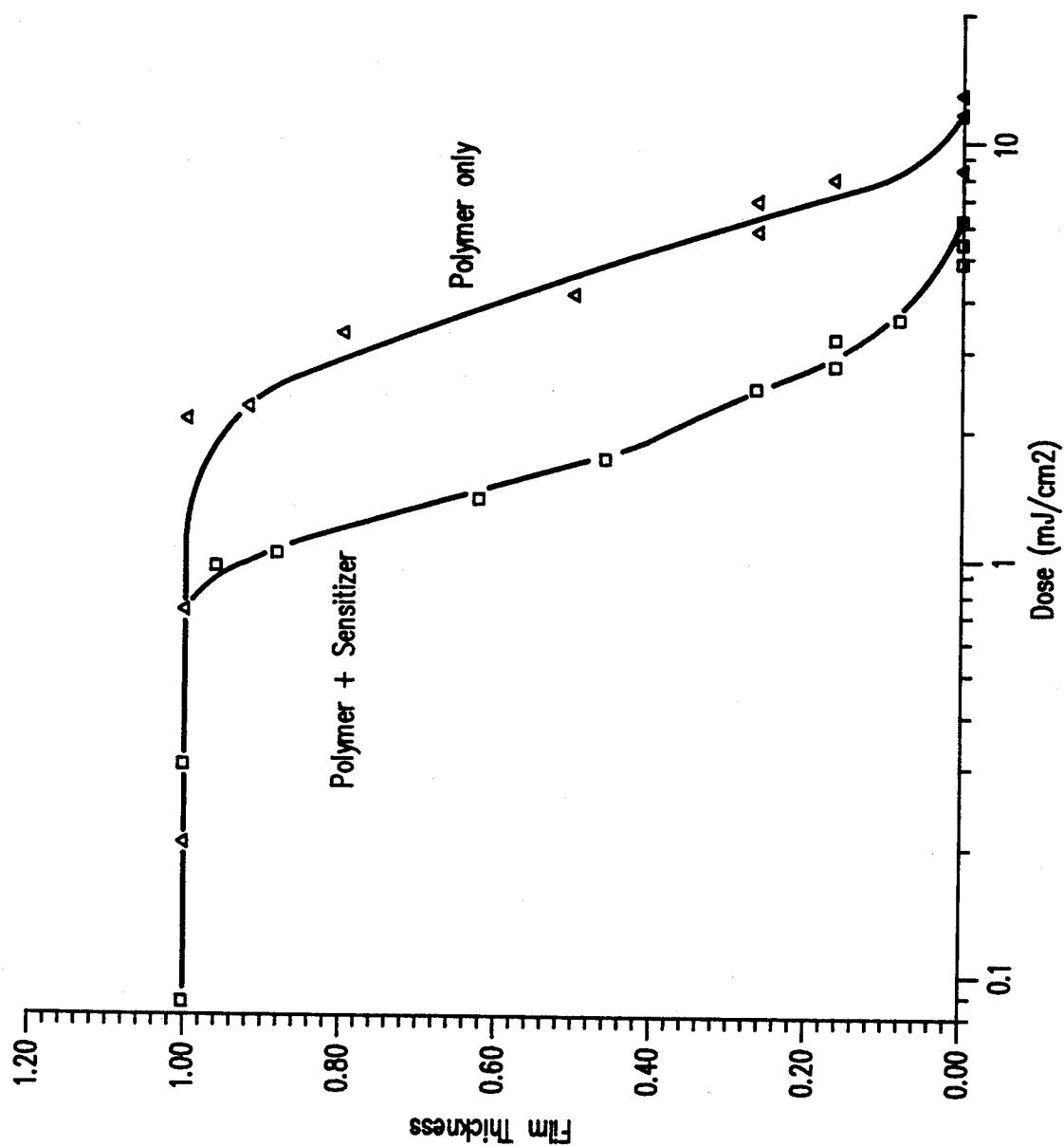

II. Films of polymethylphenylsilane and poly(ethyl-t-butylphenyl) silane with and without PIT were spin coated onto a silicon wafer. The films were then exposed to varying doses of radiation at 254 nm and developed by immersion in a 30/70 mixture of t-butylacetate/isopropyl alcohol mixture. The degree of degradation as measured by the normalized film thickness remaining was plotted as a log function of the dose to provide the sensitivity contrast curves of FIG. 1—polymethylphenylsilane with and without PIT and FIG. 2—poly(ethyl-t-butylphenyl) silane with and without PIT.

Although this invention has been described with respect to specific embodiments, the details thereof are not to be construed as limitations for it will be apparent that various embodiments, changes and modifications may be resorted to without departing from the spirit and scope thereof, and it is understood that such equivalent embodiments are intended to be included within the scope of this invention.

We claim:

1. A process for generating a positive tone resist image in a film comprising the steps of (a) forming a film comprising polyphenysilane and sulfosuccinimide; (b) imagewise exposing the film to radiation and (c) developing the image in the film.

2. The process of claim 1 wherein said sulfosuccinimide is alkylsulfosuccinimide, haloalkylsulfosuccinimide or phenylsulfosuccinimide.

* * * * *